United States Patent
Takeo et al.

(10) Patent No.: US 7,057,419 B2
(45) Date of Patent: Jun. 6, 2006

(54) PHASE SYNCHRONIZATION CIRCUIT

(75) Inventors: Yasuhito Takeo, Tokyo (JP); Nobuhiro Toyoda, Tokyo (JP); Masatoshi Tobayashi, Tokyo (JP)

(73) Assignee: NTT Electronics Corp., Tokyo (JP)

( * ) Notice: Subject to any disclaimer, the term of this patent is extended or adjusted under 35 U.S.C. 154(b) by 9 days.

(21) Appl. No.: 10/495,989

(22) PCT Filed: Jul. 30, 2002

(86) PCT No.: PCT/JP02/07717

§ 371 (c)(1),
(2), (4) Date: May 19, 2004

(87) PCT Pub. No.: WO03/061131

PCT Pub. Date: Jul. 24, 2003

(65) Prior Publication Data

US 2005/0008112 A1    Jan. 13, 2005

(30) Foreign Application Priority Data

Dec. 27, 2001    (JP) ............................. 2001-395766

(51) Int. Cl.
*G01R 23/02* (2006.01)
(52) U.S. Cl. .......................................... 327/45; 327/40
(58) Field of Classification Search ..................... None
See application file for complete search history.

(56) References Cited

U.S. PATENT DOCUMENTS

| | | | |
|---|---|---|---|
| 4,547,747 A | * 10/1985 | Wolaver et al. ............. 331/17 |
| 5,512,860 A | 4/1996 | Huscroft | |
| 5,694,088 A | 12/1997 | Dickson | |
| 6,496,555 B1 | * 12/2002 | Soda ........................... 375/376 |
| 6,701,445 B1 | * 3/2004 | Majos ......................... 713/500 |

FOREIGN PATENT DOCUMENTS

WO    WO 00/13305 A1    3/2000

* cited by examiner

*Primary Examiner*—Timothy P. Callahan
*Assistant Examiner*—Cassandra Cox
(74) *Attorney, Agent, or Firm*—Rothwell, Figg, Ernst & Manbeck

(57) ABSTRACT

In a phase sync circuit (40) which extracts a clock signal CK from a data signal D in a random NRZ format, particularly in a phase sync circuit (40) of a dual loop configuration including both a phase comparison circuit (81) and a frequency comparison circuit (10), a phase sync circuit (40) capable of achieving both broadening of the capture range and extraction of a high-quality clock signal without requiring any reference clock signal is provided. A clock signal Ca, another clock signal Cb having a phase delayed by an approximately ¼ period from the clock signal Ca and the data signal D are input to the frequency comparison circuit (10) to output a logical value according to the high-low relationship between the frequency of the clock signal and the bit rate of the data signal D. This logical value is fed back by a frequency comparison loop F2 to bring the frequency of the clock signal CK close to the bit rate of the data signal D without requiring any reference clock signal, thus achieving both broadening of the capture range and extraction of a high-quality clock signal.

10 Claims, 12 Drawing Sheets

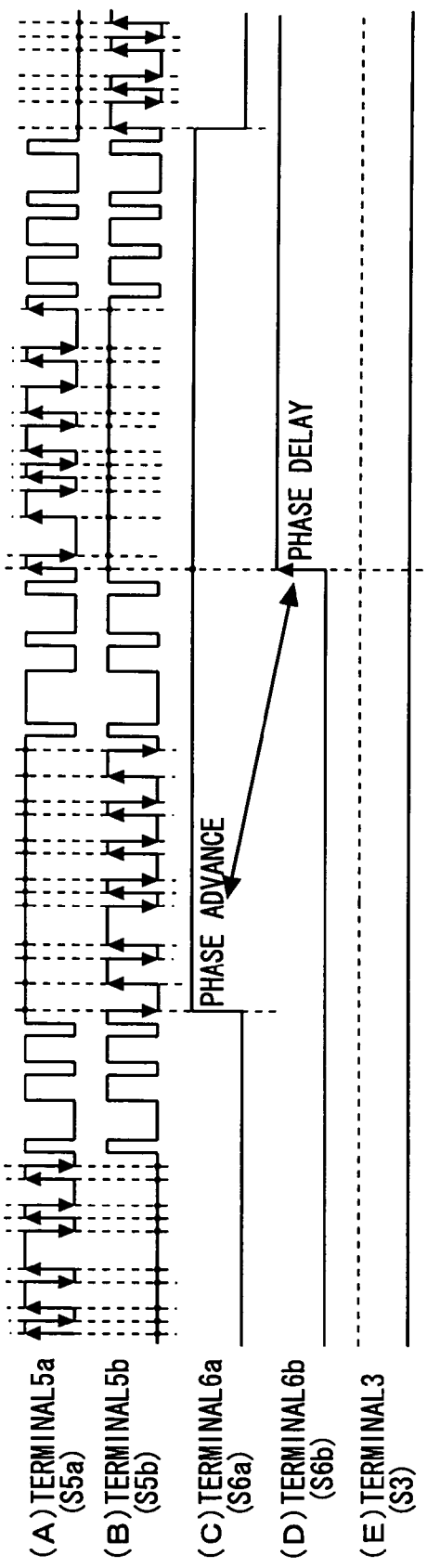
F I G. 6

PHASE SYNCHRONIZATION CIRCUIT

TECHNICAL FIELD

The present invention relates to a phase sync circuit and, more particularly, to a phase sync circuit which extracts a clock signal from a data signal in a random NRZ (non-return-to-zero) format.

BACKGROUND ART

It is required that a phase sync circuit used for the purpose of extracting a clock signal from an input data signal in a random NRZ format should continue outputting the clock signal while continuously maintaining the frequency of the clock signal without being influenced by the input data signal. For example, it is required that even in a case where a data signal having a large amount of noise in which pulse fluctuation with respect to time called jitter appears is input, or a case where a data signal such as one having a substantially long consecutive identical digits (CID) is input, the phase sync circuit should continue outputting the clock signal while constantly maintaining the frequency of the clock signal without being influenced by the input data signal. The random NRZ format is a pulse code format in which the pulse width is equal to the length of a code. If the clock signal is output with stability, it can be said that a shift of the frequency of the clock signal does not occur easily. On the contrary, in such a case, frequency acquisition to the desired condition cannot be easily performed. As a result, the capture range representing the frequency range in which phase synchronization can be performed in the phase sync circuit is necessarily reduced.

On the other hand, a voltage controlled oscillation circuit which is a component of the phase sync circuit has large variation in oscillation frequency due to its problem in terms of manufacture particularly in a case where it is implemented on an integrated circuit. If the oscillation frequency deviates largely from the bit rate of the input data signal in an initial state of the phase sync circuit due to this variation, phase synchronization is difficult since frequency adjustment cannot be easily performed. This phenomenon becomes more considerable if the above-mentioned capture range is reduced. Thus, there has been a problem that large variation cannot be tolerated in the oscillation frequency of the voltage controlled oscillation circuit in the phase sync circuit used for the purpose of extracting a clock signal because of the narrow capture range of the phase sync circuit.

A phase sync circuit having a dual-loop configuration has been frequently used to solve the above-described problem. FIG. 12 is a block diagram of a conventional phase sync circuit having a dual-loop configuration. In FIG. 12, symbol 80 denotes a conventional phase sync circuit, symbol 1 denotes a terminal through which a data signal D in a random NRZ format is input to the phase sync circuit 80; symbol 8 a terminal through which a reference lock signal RC having a frequency equal to a value obtained by dividing the bit rate of the data signal D input through the terminal 1 by a frequency division ratio N of a frequency dividing circuit 84 (described below) is input; symbol 81 a phase comparison circuit which performs phase comparison between the data signal D in the random NRZ format input through the terminal 1 and a clock signal CK output from a voltage controlled oscillation circuit 83 (described below); symbol 85 a frequency comparison circuit which performs frequency comparison between an output clock signal from a frequency dividing circuit 84 (described below) and the reference clock signal RC input through the terminal 8; symbol 82 a low-pass filter to which both a phase comparison result obtained by the phase comparison circuit 81 and a frequency comparison result obtained by the frequency comparison circuit 85 are input, and which outputs a direct-current component; symbol 83 the voltage controlled oscillation circuit which controls the oscillation frequency by the output signal from the low-pass filter 82; symbol 84 the frequency dividing circuit which divides by N the output clock signal CK from the voltage controlled oscillation circuit 83; and symbol 2 a terminal which is an output terminal of the voltage controlled oscillation circuit 83, and through which the clock signal CK extracted by the phase sync circuit 80 from the data signal D input through the terminal 1 is output.

As shown in FIG. 12, the phase sync circuit 80 has two loops, i.e., a phase comparison loop P formed by three circuits: the phase comparison circuit 81, the low-pass filter 82 and the voltage controlled oscillation circuit 83, and a frequency comparison loop F formed by four circuits: the frequency comparison circuit 85, the low-pass filter 82, the voltage controlled oscillation circuit 83 and the frequency dividing circuit 84. The phase comparison loop P is a loop for phase synchronization of the output clock signal CK from the voltage controlled oscillation circuit 83 with the data signal D in the random NRZ format input through the terminal 1. Through the loop P, the clock signal CK is extracted as high-quality clock signal from the input data signal D. On the other hand, the frequency comparison loop F functions in a case where phase synchronization cannot be easily performed only with the phase comparison loop P because of the narrow capture range of the same, particularly in a case where the oscillation frequency of the voltage controlled oscillation circuit 83 deviates largely from the bit rate of the data signal D input through the terminal, for example, in an initial state immediately after powering on. That is, the frequency comparison loop F is introduced for the purpose of ensuring normal phase synchronization with the phase comparison loop P by bringing the oscillation frequency of the voltage controlled oscillation circuit 83 close to the bit rate of the input data signal D.

The phase sync circuit 80 having the above-described dual-loop configuration is a circuit capable of achieving equivalent broadening of the capture range of the phase sync circuit 80 as well as extraction of the high-quality clock signal CK by using the frequency comparison loop F in addition to the phase comparison loop P for extracting the clock signal CK from the data signal D in the random NRZ format. However, high frequency precision is required of the reference clock signal RC necessary for the frequency comparison loop F for a reason relating to the role of the reference clock signal RC. Therefore, it has been impossible to form the oscillation circuit for generating the reference clock signal RC in an integrated circuit. There is, therefore, a need for an external circuit and there is a problem that a considerable drawback in terms of convenience and cost exists.

DISCLOSURE OF THE INVENTION

The present invention has therefore been achieved to solve the above-described problem, and an object of the present invention is to provide a phase sync circuit which extracts a clock signal CK from a data signal D in a random NRZ format, particularly a phase sync circuit of a dual-loop configuration including both a phase comparison circuit and a frequency comparison circuit, wherein both broadening of the capture range and extraction of a high-quality clock signal CK can be achieved without requiring any reference clock signal RC.

A phase sync circuit of the present invention is a phase sync circuit which extracts a clock signal from an input data signal in a random NRZ format, the phase sync circuit being characterized by having a phase comparison circuit which makes a comparison between the phase of the clock signal corresponding to an output from the phase sync circuit and the phase of the data signal input to the phase sync circuit, a frequency comparison circuit to which the clock signal, another clock signal having a phase delayed by an approximately ¼ period from the clock signal and the data signal are input, and which makes a comparison between the frequencies of the data signal and the clock signal or the another clock signal, a low-pass filter to which the result of comparison in the phase comparison circuit and the result of comparison in the frequency comparison circuit are input, and which extracts and outputs a direct-current component, and a voltage controlled oscillation circuit to which an output signal from the low-pass filter is input, and which outputs the clock signal, the phase sync circuit being also characterized in that the frequency comparison circuit has a sampling block including sampling circuits in two systems which respectively sample the clock signal and another clock signal by the data signal to separately generate output signals, a waveform shaping block in which waveform shaping is performed on each of the output signals from the sampling circuits in the two systems in the sampling block to separately generate output signals, and a phase comparison block in which an advance or a delay of the phase between the output signals from the waveform shaping block is determined.

In this phase sync circuit of the present invention, the waveform shaping block has a first delay circuit connected to the sampling circuit in one of the systems in the sampling block, a first sampling circuit connected to the first delay circuit and to the sampling circuits in the two systems, a second delay circuit connected to the sampling circuit in the other of the systems in the sampling block, and a second sampling circuit connected to the second delay circuit and to the sampling circuits in the two systems; the first sampling circuit samples and outputs the output signal from the first delay circuit when the output signal from the sampling circuit in the other of the systems changes and when the output signal from the sampling circuit in the one of the systems does not change; the second sampling circuit samples and outputs the output signal from the second delay circuit when the output signal from the sampling circuit in the one of the systems changes and when the output signal from the sampling circuit in the other of the systems does not change; the first delay circuit delays the output signal from the sampling circuit in the one of the systems by a time period required for sampling by the first sampling circuit; and the second delay circuit delays the output signal from the sampling circuit in the other of the systems by a time period required for sampling by the second sampling circuit.

In this phase sync circuit of the present invention, the phase comparison block has third and fourth sampling circuits each connected to the first sampling circuit and the second sampling circuit, and exclusive OR circuit to which outputs from the third sampling circuit and the fourth sampling circuits are input, and a fifth sampling circuit connected to the third sampling circuit and to the output side of the exclusive OR circuit; the third sampling circuit samples the output signal from the first sampling circuit when the output signal from the second sampling circuit falls; the fourth sampling circuit samples the output signal from the first sampling circuit when the output signal from the second sampling circuit rises; and the fifth sampling circuit samples and outputs the output signal from the third sampling circuit when the output signal obtained as the exclusive OR rises.

BRIEF DESCRIPTION OF THE DRAWINGS

FIG. 6 shows a timing chart under a condition that the frequency of the clock signals in First Embodiment of the present invention is higher than the bit rate of the data siginal with respect to a case where the above-described jitter is considered.

BEST MODE FOR CARRYING OUT THE INVENTION

Embodiments of the present invention will be described in detail with reference to the drawings.

Embodiment 1

Figure 1:
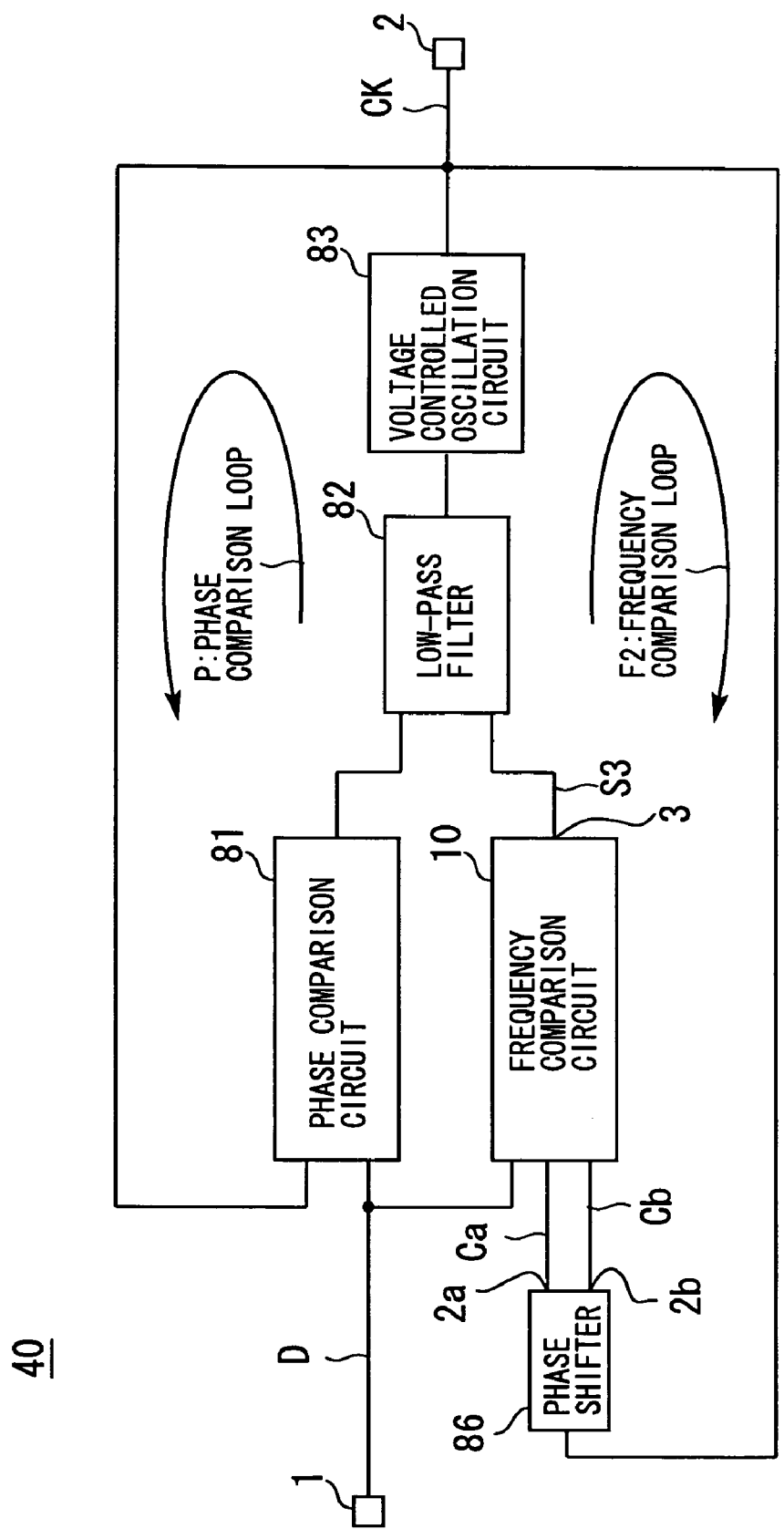
FIG. 1 is a block diagram of a phase sync circuit in First Embodiment of the present invention.

FIG. 1 is a block diagram of a phase sync circuit in Embodiment 1 of the present invention. In FIG. 1, symbol 40 denotes a phase sync circuit in accordance with the present invention, symbol 1 denotes an input terminal through which a data signal D in a random NRZ format is input; symbol 81 a phase comparison circuit which performs phase comparison between the data signal D input through the input terminal 1 and a signal CK output from a voltage controlled oscillation circuit 83 (described below); symbol 10 a frequency comparison circuit which performs frequency comparison between the data signal D input through the input terminal 1 and a signal Ca output from a terminal 2a of a phase shifter 86 (described below) or a signal Cb output from a terminal 2b of the phase shifter 86, and which produces an output through a terminal 3; symbol 82 a low-pass filter to which both a phase comparison result obtained by the phase comparison circuit 81 and a frequency comparison result obtained by the frequency comparison circuit 10 are input, and which outputs a direct-current component; symbol 83 the voltage controlled oscillation circuit which controls the oscillation frequency by the output signal from the low-pass filter 82; and symbol 86 the phase shifter which generate two clock signals Ca and Cb having a phase difference of an approximately ¼ period necessary for the frequency comparison circuit 10. The phase shifter 86 can be realized by using a delay circuit, a delay sync circuit (DLL: delay-locked loop) or the like. The above-described function of the phase shifter 86 can be realized without using the phase shifter 86 if an oscillation circuit such as a ring-type oscillation circuit capable of directly generating two clock signals Ca and Cb having a phase difference of about a ¼ period necessary for the frequency comparison circuit 10 is used as the voltage controlled oscillation circuit 83. Symbol 2 denotes an output terminal of the phase sync circuit 40 through which the clock signal CK extracted by the phase sync circuit 40 from the data signal D input through the terminal 1 is output.

Figure 12:
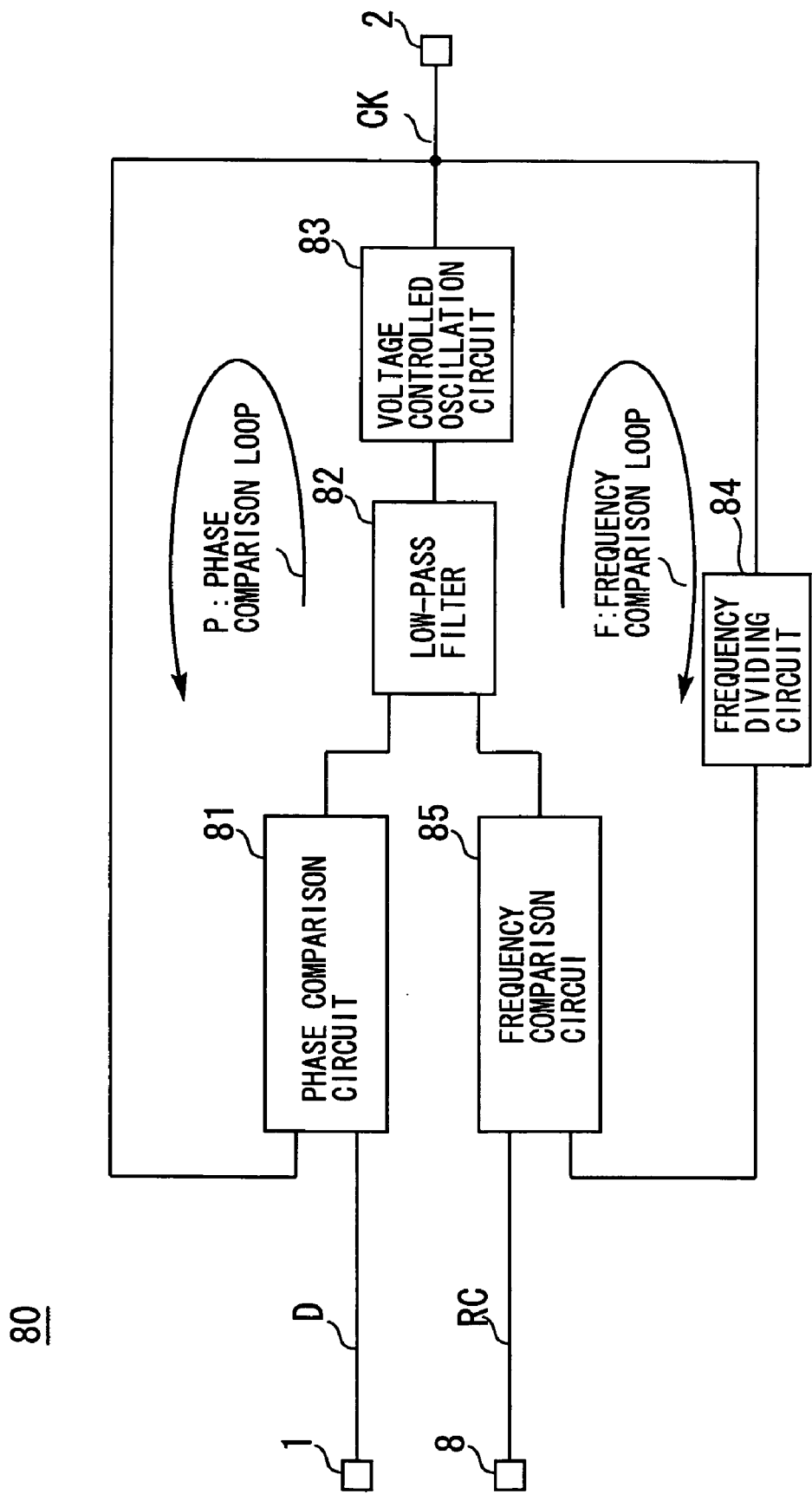
FIG. 12 is a block diagram of a conventional phase sync circuit having a dual-loop configuration.

As shown in FIG. 1, the phase sync circuit 40 two loops, i.e., a phase comparison loop P formed by three circuits: the phase comparison circuit 81, the low-pass filter 82 and the voltage controlled oscillation circuit 83, and a frequency comparison loop F2 formed by four circuits: the frequency comparison circuit 10, the low-pass filter 82, the voltage controlled oscillation circuit 83 and the phase shifter 86. As shown in FIG. 1, only the data signal D in the random NRZ format input through the terminal 1 is input to the phase sync circuit 40. There is no need for the reference clock signal RC required in the conventional phase sync circuit 80 shown in FIG. 12. Therefore, the phase sync circuit 40 is therefore advantageous in terms of convenience and cost. This advantage is due to a characteristic of the frequency comparison circuit 10 in that the frequency comparison circuit 10 can operate without using the reference clock RC unlike the frequency comparison circuit 85 in the conventional phase sync circuit 80 shown in FIG. 12.

Figure 2:
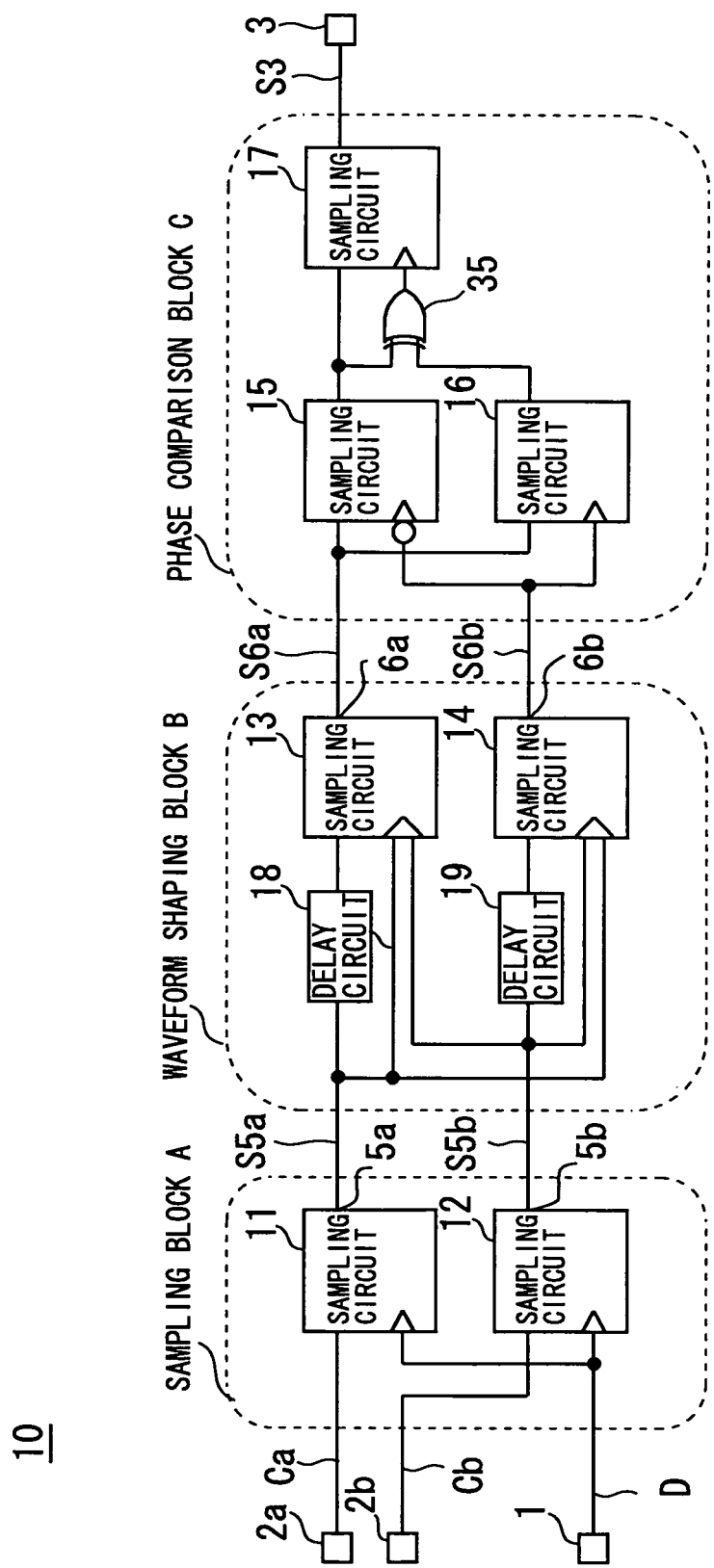
FIG. 2 is a block diagram of the frequency comparison circuit that is a component of the phase sync circuit in First Embodiment of the present invention.

FIG. 2 is a block diagram of the frequency comparison circuit 10 that is a component of the phase sync circuit in Embodiment 1 of the present invention. In FIG. 2, symbol 10 denotes the frequency comparison circuit; symbol 1 the input terminal through which the data signal D in the random NRZ format is input; symbol 2a an input terminal through which the clock signal Ca is input; and symbol 2b an input terminal through which the other clock signal Cb having its phase delayed approximately by a ¼ period with respect to the clock signal Ca input through the input terminal 12a is input. As shown in FIG. 2, the frequency comparison circuit 10 is constituted by three blocks: a sampling block A, a waveform shaping block B and a phase comparison block C. The sampling block A is constituted by sampling circuits 11 and 12 forming two systems in which the clock signals Ca and Cb input through the input terminals 2a and 2b are respectively sampled by the data signal D input through the input terminal 1. An output signal from a terminal 5a of the sampling circuit 11 is represented by S5a, and an output signal from a terminal 5b of the sampling circuit 12 is represented by S5b. A waveform shaping block B shapes waveforms of each of the output signals S5a and S5b in two systems from the sampling block A. The output signal from the terminal 6a of the waveform shaping block B is represented by S6a, the output signal from the terminal 6b is represented by S6b. In the phase comparison block C, an advance or a delay of the phase between output signals S6a and S6b from two systems in the waveform shaping block B is determined. Symbol 3 denotes an output terminal of the phase comparison block C corresponding to the output terminal of the frequency comparison circuit 10. The output signal from the terminal 3 is represented by S3.

The waveform shaping block B shown in FIG. 2 has a delay circuit 18 (first delay circuit) connected to the terminal 5a of the sampling circuit 11 (the sampling circuit in one system in the sampling block A), a sampling circuit 13 (first sampling circuit) connected to the delay circuit 18, the terminal 5a of the sampling circuit 11 and the terminal 5b of the sampling circuit 12. The waveform shaping block B further has a delay circuit 19 (second delay circuit) connected to the sampling circuit 12 (the sampling circuit in the other system in the sampling block A), a sampling circuit 14 (second sampling circuit) connected to the delay circuit 19, the terminal 5a of the sampling circuit 11 and the terminal 5b of the sampling circuit 12.

As shown in FIG. 2, the sampling circuit 13 samples the output signal from the delay circuit 18 when the signal S5b at the output terminal 5b of the sampling circuit 12 changes while the signal S5a at the output terminal 5a of the sampling circuit 11 does not change. On the other hand, the sampling circuit 14 samples the output signal from the delay circuit 19 when the signal at the output terminal 5a of the sampling circuit 11 changes while the signal at the output terminal 5b of the sampling circuit 12 does not change. The delay circuit 18 delays the signal S5a at the terminal 5a by a time period necessary for sampling in the sampling circuit 13. The delay circuit 19 delays the signal S5b at the terminal 5b by a time period necessary for sampling in the sampling circuit 14. A terminal 6a is an output terminal of the sampling circuit 13 corresponding to one output terminal of the waveform shaping block B. A terminal 6b is an output terminal of the sampling circuit 14, which also the other output terminal of the waveform shaping block B.

The phase comparison block shown in FIG. 2 has a sampling circuit 15 (third sampling circuit) and a sampling circuit 16 (fourth sampling circuit) each connected to the sampling circuit 13 and the sampling circuit 14, an exclusive OR circuit 35 to which each of outputs from the sampling circuit 15 and the sampling circuit 16 is input, and a sampling circuit 17 (fifth sampling circuit) connected to the output side of the sampling circuit 15 and to the output side of the exclusive OR circuit 35.

As shown in FIG. 2, the sampling circuit 15 samples the signal S6a at the output terminal 6a of the waveform shaping block B when the signal S6b at the output terminal 6b of the waveform shaping block B falls. On the other hand, the sampling circuit 16 samples the signal S6a at the output terminal 6a when the signal S6b at the output terminal 6b falls. The exclusive OR (EX-OR) circuit 35 generates the exclusive OR of the output signals from the sampling circuits 15 and 16. The sampling circuit 17 samples the output signal from the sampling circuit 15 when the output signal from the exclusive OR circuit 35 rises. The terminal 3 is the output terminal of the sampling circuit 17 corresponding to the output circuit of the phase comparison block C.

Figure 3:
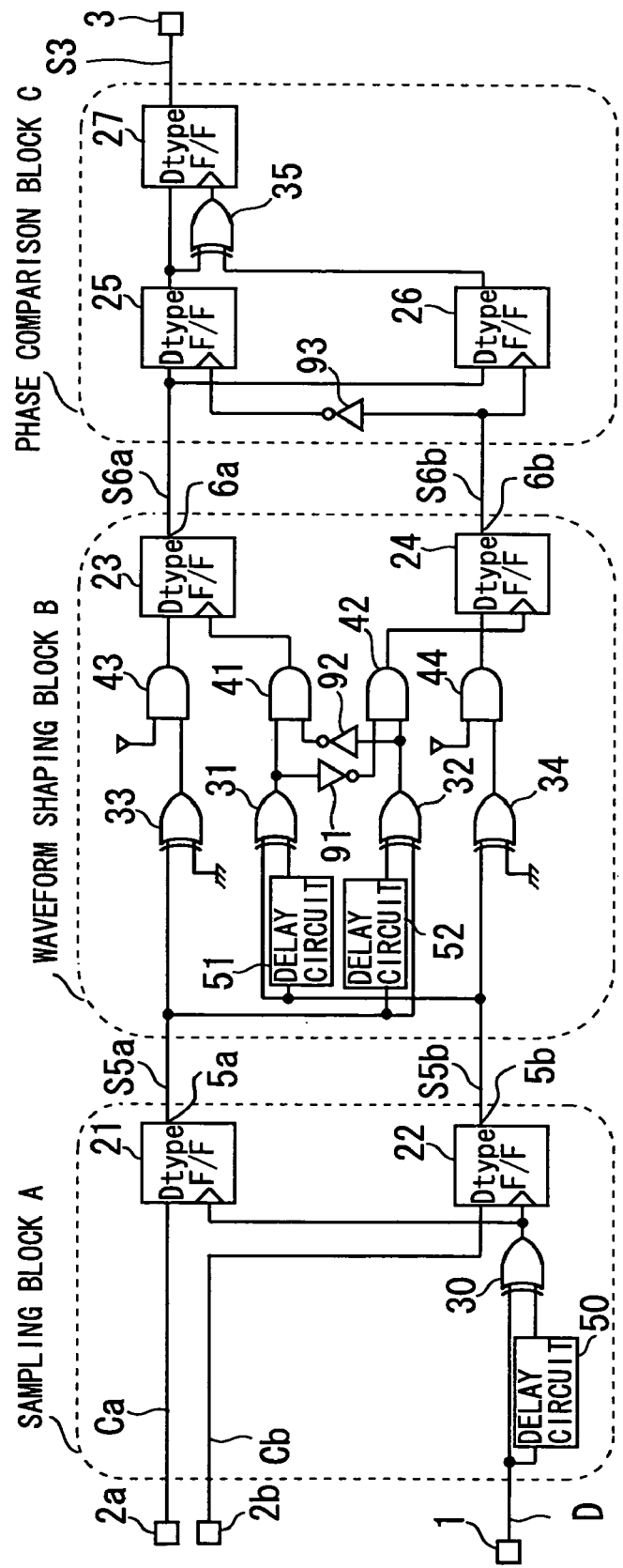
FIG. 3 is an example of a circuit representing details of the frequency comparison circuit in First Embodiment of the present invention.

FIG. 3 is an example of a circuit 20 representing details of the frequency comparison circuit 10 in Embodiment 1 of the present invention. In FIG. 3, the same portions as those shown in FIG. 2 are indicated by the same symbols. No description will be made of the corresponding elements. In FIG. 3, symbol 20 denotes an example of a circuit (hereinafter referred to as "frequency comparison circuit 20") representing details of the frequency comparison circuit 10; symbols 21 to 27 denote D flip flop (F/F) circuits; symbols 30 to 35 denote exclusive OR (EX-OR) circuits; symbols 41 to 44 denote logical product (AND) circuits; symbols 91 to 93 denote inversion (NOT) circuits; and symbols 50 to 52 denote delay circuits. The delay circuit 50 and the EX-OR circuit 30 form an edge detection circuit. Similarly, the delay circuit 51 and the EX-OR circuit 31 form an edge detection circuit, and the delay circuit 52 and the EX-OR circuit 32 form an edge detection circuit. The EX-OR circuit 33 and the AND circuit 43, and the EX-OR circuit 34 and the AND circuit 44 respectively correspond to the delay circuits 18 and 19 in the frequency comparison circuit 10 shown in FIG. 2 and are introduced for delay correction (described below). Through the output terminal 3 of the frequency comparison circuit 20, a logical value according to the high-low relationship between the frequency of the clock signals Ca and Cb input through the input terminals 2a and 2b and the bit rate of the data signal D input through the input terminal 1. Therefore, in a case where the frequency comparison circuit 20 is used as the frequency comparison circuit 10 of the phase sync circuit 40 shown in FIG. 1, an operation can be realized such that the logical value output through the output terminal 3 is negatively fed back by the frequency comparison loop F2 to bring the frequency of the clock signal CK close to the bit rate of the data signal D.

The principle of the operation of the frequency comparison circuit 10 in the phase sync circuit 40 will be described in detail by using the frequency comparison circuit 20 shown in FIG. 3, which is a circuit representing an example of details of the frequency comparison circuit 10.

Description will be made by first assuming that the data signal D in the random NRZ format input through the terminal as shown in FIG. 3 is a signal ( . . . 1010 . . . ) with a transition density of 1. The transition density is the probability of the signal changing in a time slot which is a minimum unit of a code.

Figure 4:
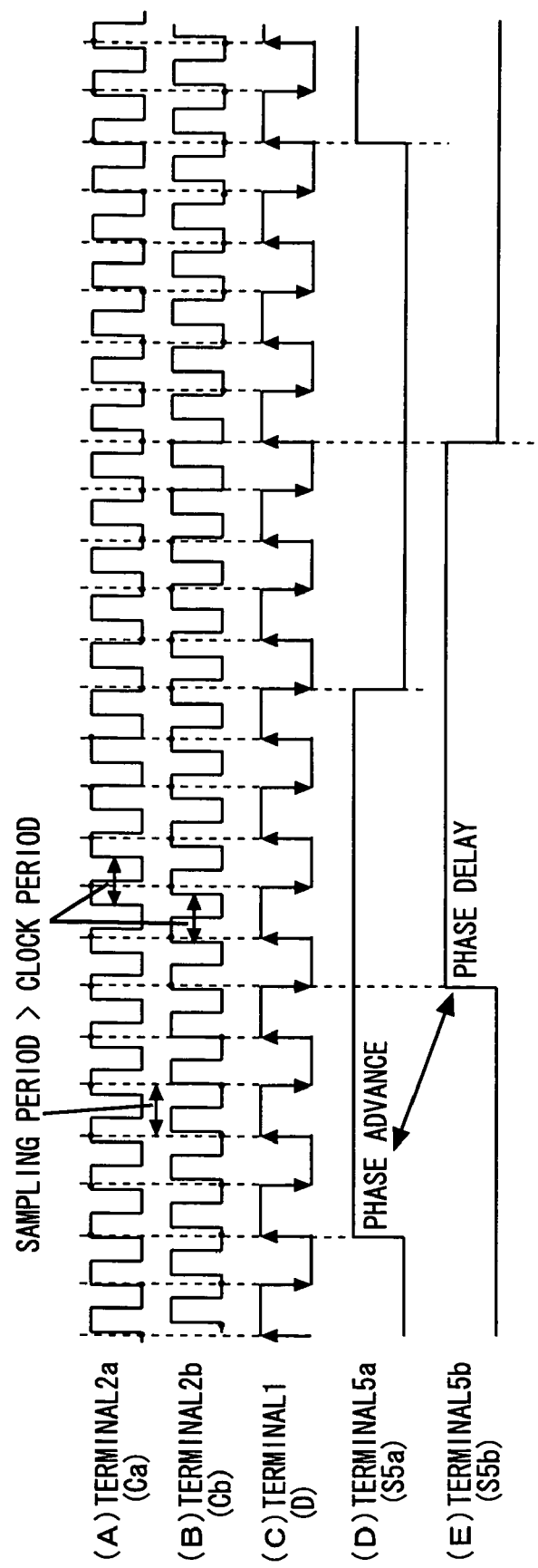
FIG. 4 shows an ideal timing chart under a condition that the frequency of the clock signals input through input terminals in First Embodiment of the present invention is higher than the bit rate of the data signal.
Figure 5:
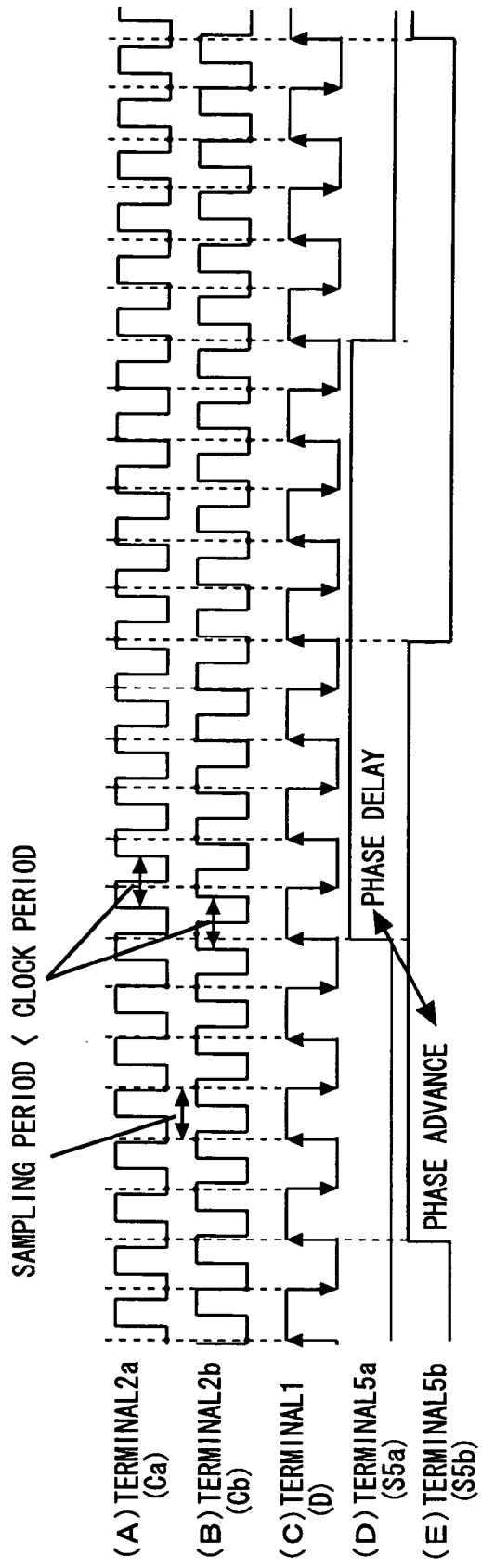
FIG. 5 shows an ideal timing chart under a condition that the frequency of the clock signals input through input terminals in First Embodiment of the present invention is lower than the bit rate of the data signal.

FIG. 4 shows an ideal timing chart under a condition that the frequency of the clock signals Ca and Cb input through the input terminals 2a and 2b in Embodiment 1 of the present invention is higher than the bit rate of the data signal D. FIG. 5 shows an ideal timing chart under a condition that the frequency of the clock signals Ca and Cb input through the input terminals 2a and 2b in Embodiment 1 of the present invention is lower than the bit rate of the data signal D. FIG. 4(A) and FIG. 5(A) show the clock signal Ca input through the input terminal 2a; FIG. 4(B) and FIG. 5(B) show the other clock signal Cb input through the input terminal 2b; FIG. 4(C) and FIG. 5(C) show the data signal D input through the input terminal 1; FIG. 4(D) and FIG. 5(D) show the signal S5a at the output terminal 5a of the D flip flop circuit 21: and FIG. 4(E) and FIG. 5(E) show the signal S5b at the output terminal 5b of the D flip flop circuit 22.

As shown in FIG. 4, under the condition that the frequency of the input clock signals Ca and Cb is higher than the bit rate of the data signal D, the clock signals Ca and Cb from the input terminals 2a and 2b are sampled in a period slightly longer than the clock period by the data signal D from the input terminal 1, as shown in FIGS. 4(A) to 4(C). As shown in FIG. 5, under the condition that the frequency of the input clock signals Ca and Cb is lower than the bit rate of the data signal D, the clock signals Ca and Cb from the input terminals 2a and 2b are sampled in a period slightly shorter than the clock period by the data signal D from the input terminal 1, as shown in FIGS. 5(A) to 5(C). As a result, signals S5a and S5b having such a waveform that their period is much longer than those of the input clock signals Ca and Cb and the data signal D appear at the terminals 5a and 5b, as shown in FIG. 4(D) and FIG. 4(E) and in FIG. 5(D) and FIG. 5(E).

The waveforms of the signals S5a and S5b appearing at the terminals 5a and 5b have two main characteristics described below.

[1] The frequency is approximately equal to the difference between the frequency of the input clock signals Ca and Cb and the bit rate of the data signal D.

[2] A phase advance/delay occurs between the waveforms of the signals S5a and S5b appearing at the terminals 5a and 5b according to the high-low relationship between the frequency of the input clock signals Ca and Cb and the bit rate of the data signal D.

The above-described characteristic [2] in particular is clarified in FIGS. 4 and 5. Under the condition that the frequency of the input clock signals Ca and Cb is higher than the bit rate of the data signal D, the phase of the signal S5a at the terminal 5a advances relative to that of the signal S5b at the terminal 5b (see FIGS. 4(D) and 4(E)). Under the condition that the frequency of the input clock signals Ca and Cb is lower than the bit rate of the data signal D, the phase of the signal S5a at the terminal 5a delays relative to that of the signal S5b at the terminal 5b (see FIGS. 5(D) and 5(E)). The basic principle of operation of this frequency comparison circuit 20 is determination of the high-low relationship between the frequency of the input clock signals Ca and Cb and the bit rate of the data signal D made by utilizing the above-described characteristic [2]. The characteristic [2] will be hereinafter referred to as "principle of frequency comparison". The above-described function can be realized with the sampling block A formed by the D flip flop circuits 21 and 22, the EX-OR circuit 30 and the delay circuit 50 in the frequency comparison circuit 20 shown in FIG. 3.

Figure 7:
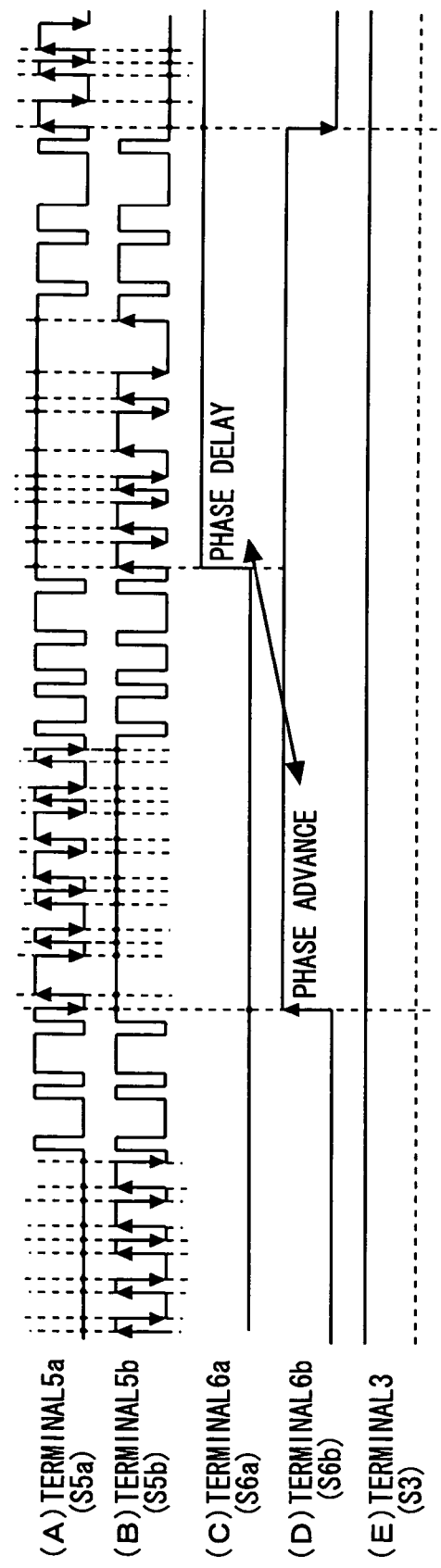
FIG. 7 shows a timing chart under a condition that the frequency of the clock signals in First Embodiment of the present invention is higher than the bit rate of the data siginal and that the transition density of the data siginal is low.

However, even on the assumption that the input data signal D in the random NRZ format is the above-mentioned signal having a transition density of 1, waveforms such as those shown in FIGS. 4 and 5 on the assumption of the ideal conditions do not result since in actuality waveform fluctuation with respect to time called jitter occurs in the data signal D. FIG. 6 shows a timing chart under a condition that the frequency of the clock signals Ca and Cb in Embodiment 1 of the present invention is higher than the bit rate of the data signal D with respect to a case where the above-described jitter is considered. FIG. 7 shows a timing chart under a condition that the frequency of the clock signals Ca and Cb in Embodiment 1 of the present invention is lower than the bit rate of the data signal D. FIG. 6(A) and FIG. 7(A) show the signal S5a at the output terminal 5a of the D flip flop circuit 21; FIG. 6(B) and FIG. 7(B) show the signal S5b at the output terminal 5b of the D flip flop circuit 22; FIG. 6(C) and FIG. 7(C) show the signal S6a at the output terminal 6a of the D flip flop circuit 23; FIG. 6(D) and FIG. 7(D) show the signal S6b at the output terminal 6b of the D flip flop circuit 24; and FIG. 6(E) and FIG. 7(E) show a signal S3 at the output terminal 3 of the D flip flop circuit 27, which is an output signal of the frequency comparison circuit 20.

As shown in FIGS. 6(A) and 6(B) and FIGS. 7(A) and 7(B), a number of pulses of a reduced width occur in the waveforms of signals S5a and S5b appearing at the terminals 5a and 5b in contrast to the waveforms of the signals S5a and S5b in FIGS. 4(D) and 4(E) and FIGS. 5(D) and 5(E) under the condition that there is no jitter. These pulses occur as a result of fluctuation of sampling timing in the D flip flop circuits 21 and 22 with respect to time due to jitter contained in the input data signal D. Therefore, the minimum value of this pulse width is substantially equal to the pulse width of the input data signal D. The pulses seem to appear irregularly because the above-mentioned sampling point fluctuates irregularly with respect to time due to the irregularity of jitter in the input data signal D. The number of pulses generated as described above is increased if the above-mentioned jitter becomes larger or if the difference between the frequency of the input clock signals Ca and Cb and the bit rate of the data signal D is smaller. With the appearance of these pulses, the waveforms of the signals S5*a* and S5*b* appearing at the terminals 5*a* and 5*b* become complicated, so that the above-described "principle of frequency comparison" is not easily recognizable.

On the other hand, as shown in FIGS. 6(C) and 6(D) and FIGS. 7(C) and 7(D), the pulses due to the above-mentioned jitter disappear and waveforms similar to the waveforms shown in FIGS. 4(D) and 4(E) and FIGS. 5(D) and 5(E) as the waveforms at the output terminals 5*a* and 5*b* of the sampling block A under the ideal conditions appear in the waveforms of the signals S6*a* and S6*b* appearing at the terminals 6*a* and 6*b*, and the waveforms of the signals S6*a* and S6*b* have the characteristic corresponding to the "principle of frequency comparison ". This means that the "principle of frequency comparison" buried in jitter contained in the input data signal D at the terminals 5*a* and 5*b* is dug up at the terminals 6*a* and 6*b*. This function can be realized by the waveform shaping block B constituted by the D flip flop circuits 23 and 24, the EX-OR circuits 31 to 34, the AND circuits 41 to 44, the NOT circuits 91 and 92 and the delay circuits 51 and 52 in the frequency comparison circuit 20 shown in FIG. 3.

The principle of shaping of the waveform in the waveform shaping block B will be described with reference to FIG. 6 by way of example. As shown in FIG. 6, the signal S6*a* at the terminal 6*a* is obtained by sampling the signal S5*a* at the terminal 5*a* as shown in FIGS. 6(A) to 6(D) when the condition "(1) the signal S5*b* at the terminal 5*b* changes" and the condition "(2) the signal S5*a* at the terminal 5*a* does not change" are satisfied. The condition (1) can be realized by the edge detection circuit formed by the delay circuit 51 and the EX-OR circuit 31 as shown in FIG. 3, and the condition (2) can be realized by the edge detection circuit formed by the delay circuit 52, the EX-OR circuit 32 and the NOT circuit 92. The EX-OR circuit 33 and the AND circuit 43 are introduced as a delay correction circuit for canceling out a delay between the input and output of the above-described edge detection circuits and the AND circuit 41. Similarly, as shown in FIGS. 6(A) to 6(D), the signal S6*b* at the terminal 6*b* is obtained by sampling the signal S5*b* at the terminal 5*b* when the condition "(3) the signal S5*a* at the terminal 5*a* changes" and the condition "(4) the signal S5*b* at the terminal 5*b* does not change" are satisfied. The condition (3) can be realized by the edge detection circuit formed by the delay circuit 52 and the EX-OR circuit 32 as shown in FIG. 3, and the condition (4) can be realized by the edge detection circuit formed by the delay circuit 51, the EX-OR circuit 31 and the NOT circuit 91. The EX-OR circuit 34 and the AND circuit 44 are introduced as a delay correction circuit for canceling a delay between the input and output of the above-described edge detection circuits and the AND circuit 42. From the above description of the principle of operation of the waveform shaping block B, it can be confirmed that the circuit in the corresponding portion shown in FIG. 3 is one of an example of implementation of the corresponding portion shown in FIG. 2.

In the above-described arrangement, the waveforms of the signals S6*a* and S6*b* appearing at the terminals 6*a* and 6*b* have the characteristic corresponding to the "principle of frequency comparison", as shown in FIGS. 6(C) and 6(D) and FIGS. 7(C) and 7(D). Further, as shown in FIG. 6(E) and FIG. 7(E), the signal S3 appearing at the terminal 3 is a logical signal according to the advance/delay of the phase between the signals S6*a* and S6*b* at the terminals 6*a* and 6*b*. This means that the high-low relationship between the frequency of the input clock signals Ca and Cb and the bit rate of the data signal D is determined from the "principle of frequency comparison". For example, as shown in FIG. 6, under the condition that the frequency of the input clock signals Ca and Cb is higher than the bit rate of the data signal D, the phase of the waveform of the signal S6*a* appearing at the terminal 6*a* advances relative to the phase at the terminal 6*b*. The signal S3 at the output terminal 3 of the frequency comparison circuit 20 is thereby set to a low level. In a case where the frequency comparison circuit 20 is used as the frequency comparison circuit 10 of the phase sync circuit 40 shown in FIG. 1, the above-mentioned low-level output signal S3 is negatively fed back by the frequency comparison loop F2 to perform overall control on the phase sync circuit 40 so that the frequency of the clock signal CK that is the output signal of the voltage controlled oscillation circuit 83 is reduced.

On the other hand, as shown in FIG. 7, under the condition that the frequency of the input clock signals Ca and Cb is higher than the bit rate of the data signal D, the phase of the waveform of the signal S6*a* appearing at the terminal 6*a* delays relative to the phase at the terminal 6*b*. The signal S3 at the output terminal 3 of the frequency comparison circuit 20 is thereby set to a high level. This high-level output signal S3 is negatively fed back by the frequency comparison loop F2 of the phase sync circuit 40 to perform overall control on the phase sync circuit 40 so that the frequency of the clock signal CK is increased. The above-described function of determining the high-low relationship between the frequency of the input clock signals Ca and Cb and the bit rate of the data signal D according to the "principle of frequency comparison" is realized by the phase comparison block C constituted by the D flip flop circuits 25 to 27, the EX-OR circuit 35 and the NOT circuit 93 in the frequency comparison circuit 20 shown in FIG. 3.

The description has been made on the assumption that the data signal D in the random NRZ format input to through the terminal 1 is a signal having a transition density of 1. The operation will next be described with respect to a signal having a lower transition density by considering a case with an actual signal.

Figure 8:
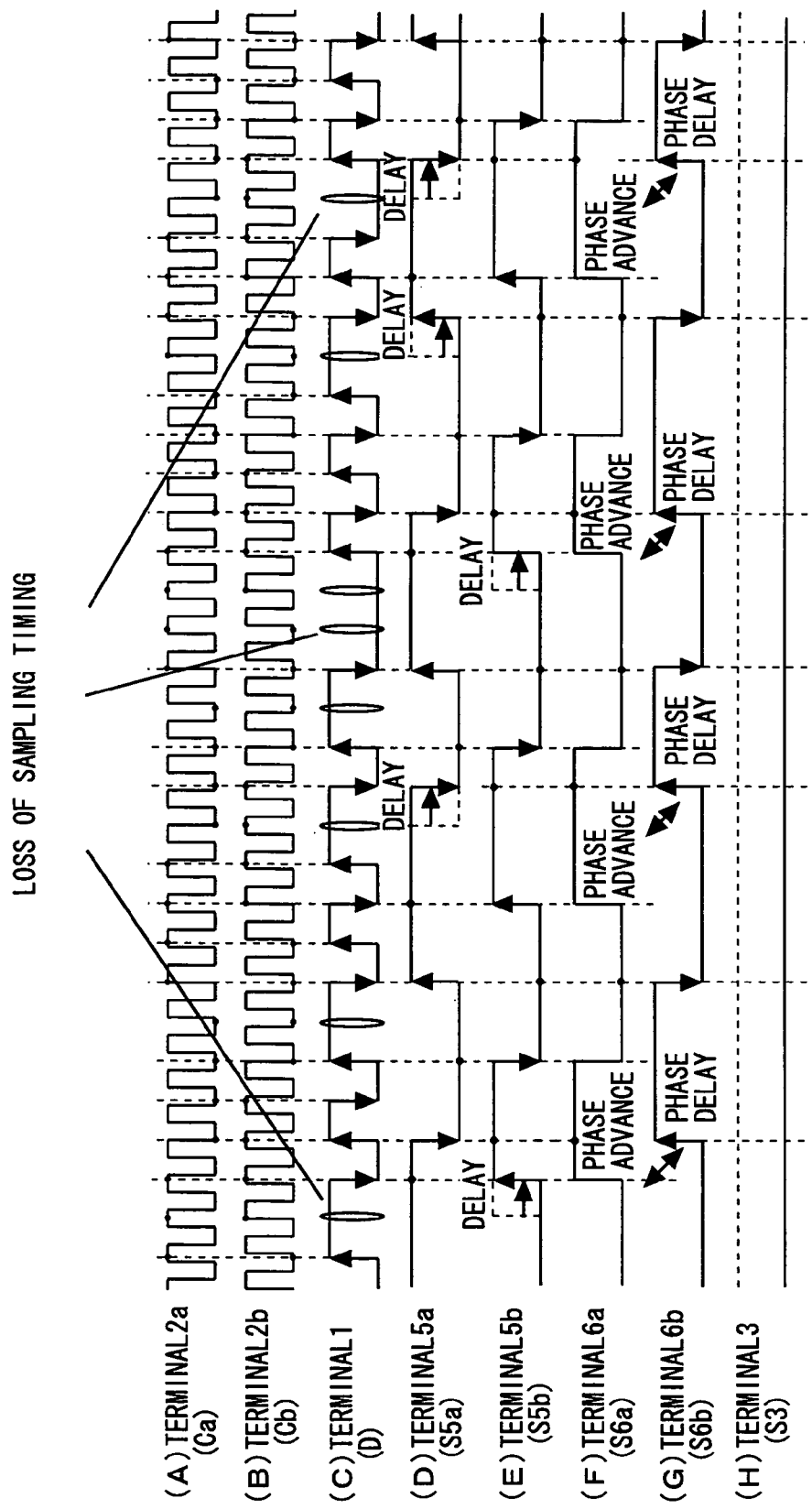

FIG. 8 shows a timing chart under a condition that the frequency of the input clock signals Ca and Cb in Embodiment 1 of the present invention is higher than the bit rate of the data signal D and that the transition density of the data signal D is low. FIG. 8(A) shows the clock signal Ca input through the input terminal 2*a*; FIG. 8(B) shows the other clock signal Cb input through the input terminal 2*b*; FIG. 8(C) shows the data signal D in the random NRZ format input through the input terminal 1 and having a low transition density; FIG. 8(D) shows the signal S5*a* at the output terminal 5*a* of the D flip flop circuit 21; FIG. 8(E) shows the signal S5*b* at the output terminal 5*b* of the D flip flop circuit 22: FIG. 8(F) shows the signal S6*a* at the output terminal 6*a* of the D flip flop circuit 23; FIG. 8(G) shows the signal S6*b* at the output terminal 6*b* of the D flip flop circuit 24; and FIG. 8(H) shows the signal S3 at the output terminal 3 of the D flip clop circuit 27 corresponding to an output signal from the frequency comparison circuit 20.

As shown in FIGS. 8(A) to 8(H), losses of sampling timing occur in the D flip flop circuits 21 and 22 due to the low transition density of the data signal D input through the input terminal 1. The waveforms of the signals S5*a* and S5*b* at the terminals 5*a* and 5*b* are delayed by amounts corresponding to the losses of sampling timing. As shown in FIG. 8, the waveforms of the signals S5*a* and S5*b* at the terminals 5*a* and 5*b* still have the characteristic corresponding to the above-described "principle of frequency comparison" when the transition density is not so low, that is, when the occurrence of loss of sampling timing is low. The characteristic also appears in the waveforms of the signals S6*a* and S6*b* at the terminals 6*a* and 6*b* after processing in the waveform shaping block B. From this characteristic of the waveforms, frequency comparison is performed on the basis of the above-described "principle of frequency comparison" in the phase comparison block C. Jitter contained in the input data signal D is not considered here. However, even in a case where jitter is considered, the waveform shaping block B functions as described above and, therefore, the waveforms of the signals S6*a* and S6*b* at the terminals 6*a* and 6*b* have the characteristic corresponding to the above-described "principle of frequency comparison" and the frequency comparison circuit 20 operates normally.

If the transition density is further reduced, that is, the occurrence of loss of sampling timing is higher, there is a possibility of the waveforms of the signals S6*a* and S6*b* at the terminals 6*a* and 6*b* losing the characteristic corresponding to the above-described "principle of frequency comparison".

Figure 9:
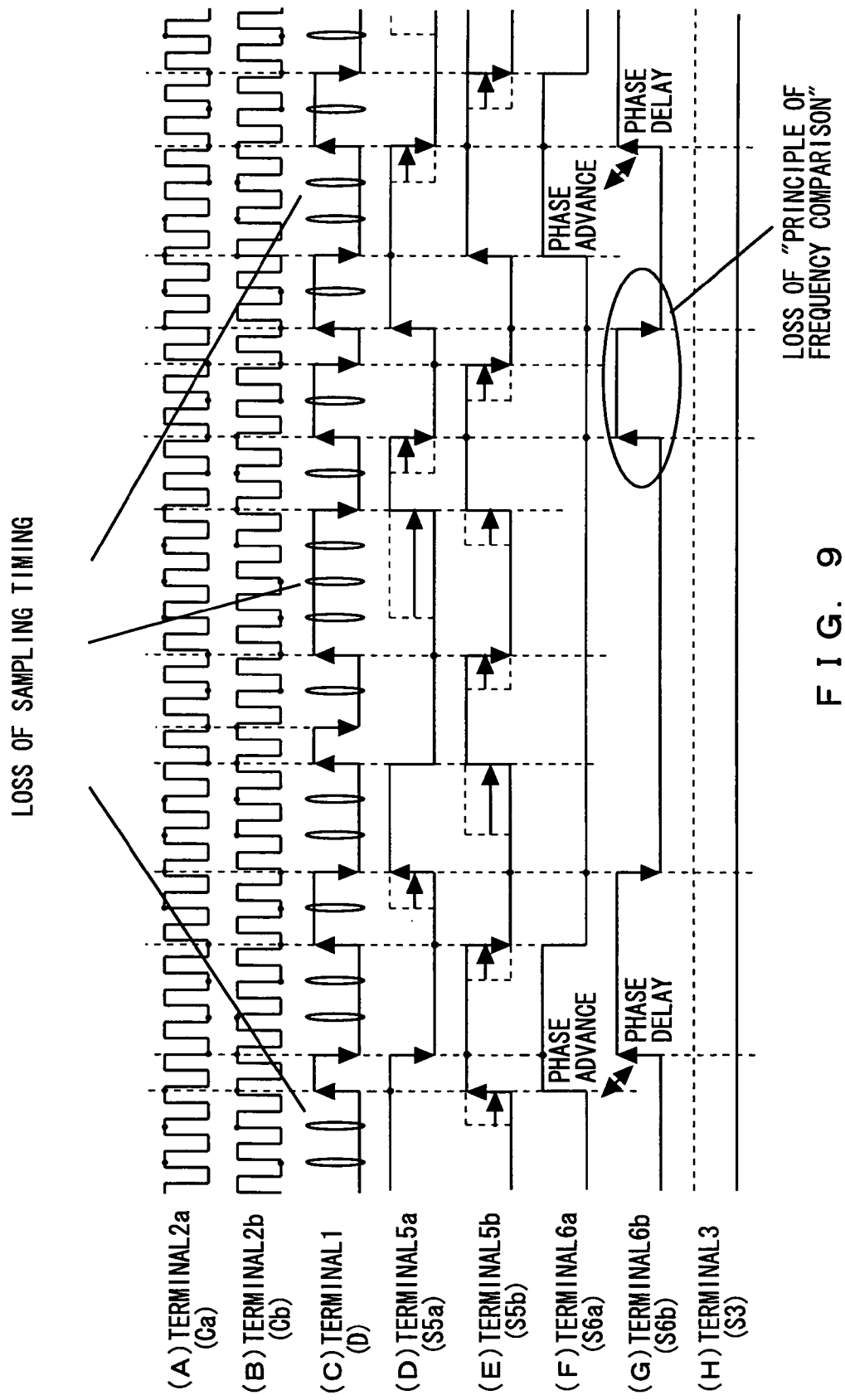
FIG. 9 shows by way of example a timing chart under a condition that the frequency of the input clock signals in First Embodiment of the present invention is higher than the bit rate of the data signal and that the transition density of the data signal is much lower than that in the case shown in FIG. 8.

FIG. 9 shows by way of example a timing chart under a condition that the frequency of the input clock signals Ca and Cb in Embodiment 1 of the present invention is higher than the bit rate of the data signal D and that the transition density of the data signal D is much lower than that in the case shown in FIG. 8. FIG. 9(A) shows the clock signal Ca input through the input terminal 2*a*; FIG. 9(B) shows the other clock signal Cb input through the input terminal 2*b*; FIG. 9(C) shows the data signal D in the random NRZ format input through the input terminal 1 and having a much lower transition density; FIG. 9(D) shows the signal S5*a* at the output terminal 5*a* of the D flip flop circuit 21; FIG. 9(E) shows the signal S5*b* at the output terminal 5*b* of the D flip flop circuit 22; FIG. 9(F) shows the signal S6*a* at the output terminal 6*a* of the D flip flop circuit 23; FIG. 9(G) shows the signal S6*b* at the output terminal 6*b* of the D flip flop circuit 24; and FIG. 9(H) shows the signal S3 at the output terminal 3 of the D flip flop 27 corresponding to an output signal from the frequency comparison circuit 20.

As shown in FIGS. 9(A) to 9(H), the occurrence of loss of sampling timing is increased since the transition density of the data signal D input through the input terminal 1 is much lower than that in the case shown in FIG. 8. Due to this, the waveforms of the signals S6*a* and S6*b* at the terminals 6*a* and 6*b* temporarily lose the characteristic corresponding to the above-described "principle of frequency comparison". Even in this situation, however, the signal S3 at the output terminal 3 of the frequency comparison circuit 20 maintains a certain logical output level and frequency comparison is performed with stability. This operation can be realized by using, as means for performing frequency comparison in the phase comparison block C according to the above-described "principle of frequency comparison", both the result of sampling of the signal S6*a* at the terminal 6*a* when the signal S6*b* at the terminal 6*b* rises and the result of sampling of the signal S6*a* at the terminal 6*a* when the signal S6*b* at the terminal 6*b* falls. For example, in FIGS. 8(F) and 8(G), the result of sampling of the signal S6*a* at the terminal 6*a* when the signal S6*b* at the terminal 6*b* rises is high level, while the result of sampling of the signal S6*a* at the terminal 6*a* when the signal S6*b* at the terminal 6*b* falls is low level. From these two sampling results, it can be roughly determined that the desired waveforms appear in the signals S6*a* and S6*b* at the terminals 6*a* and 6*b*. Further, the results also mean that the phase of the signal S6*a* at the terminal 6*a* advances relative to that of the signal S6*b* at the terminal 6*b*.

On the other hand, in FIGS. 9(F) and 9(G), at a portion where the characteristic corresponding to the above-described "principle of frequency comparison" is temporarily unrecognizable, both the result of sampling of the signal S6*a* at the terminal 6*a* when the signal S6*b* at the terminal 6*b* rises and the result of sampling of the signal S6*a* at the terminal 6*a* when the signal S6*b* at the terminal 6*b* falls are high level. This means that the desired waveforms do not appear in the signals S6*a* and S6*b* at the terminals 6*a* and 6*b*. With respect to such temporary behavior, the phase comparison block C operates so as to maintain the preceding state. By this function, stable frequency comparison such as that described above can be realized.

A simpler phase comparison block other than the circuit corresponding to the phase comparison block C shown in FIG. 3, e.g., one constituted only by a D flip flop which samples the signal S6*a* at the terminal 6*a* when the signal S6*b* at the terminal 6*b* falls may suffice. Such a circuit, however, does not have the function of maintaining the preceding condition in a case where the characteristic corresponding to the above-described "principle of frequency comparison" is temporarily unrecognizable. Therefore, there is a possibility of output from such a circuit changes temporarily and there is a possibility of failure to make determination in frequency comparison with stability. Such determination with reduced stability occurs more easily if the transition density of the input data signal D in the random NRZ format is lower or if the difference between the frequency of the input clock signals Ca and Cb and the bit rate of the data signal D is larger. The robustness against it is largely improved if the phase comparison block C shown in FIG. 3 is used.

The operation in a case where the above-described frequency comparison circuit, e.g., the frequency comparison circuit 20 shown in FIG. 3 is used as the frequency comparison circuit 10 of the phase sync circuit 40 shown in FIG. 1 will next be described.

Ordinarily, when the phase sync circuit 40 is in an initial state, the frequency of the clock signal CK output from the voltage controlled oscillation circuit 83 deviates largely from the bit rate of the data signal D. In such a situation, the frequency comparison loop F2 on the frequency comparison circuit 10 operates to bring the frequency of the clock signal CK close to the bit rate of the data signal D by its negative feedback operation. When the frequency of the clock signal CK falls into the frequency range in which phase synchronization can be performed by the phase comparison loop P on the phase comparison circuit 81, the phase comparison loop P operates to realize phase synchronization of the input data signal D and the clock signal CK by its negative feedback operation.

Determination as to switching between the frequency comparison loop F2 and the phase comparison loop P can be realized by preparing a circuit for switching determination separately from the phase sync circuit 40 shown in FIG. 1. This switching determination circuit can be simplified by using internal circuit portions of the phase comparison circuit 81 and the frequency comparison circuit 10 particularly when the switching determination circuit is formed in an integrated circuit together with the phase sync circuit 40. For example, in a case where the frequency comparison circuit 20 shown in FIG. 3 is used as the frequency comparison circuit 10, the method of using the sampling block A and using the signal S5b at the output terminal 5b, the method of also using the waveform shaping block B and using the signal S6b at the output terminal 6b, or the like is conceivable. The power consumption for all the functions for phase synchronization can be reduced by simplifying the switching determination circuit as described above.

Thus, according to Embodiment 1, in a phase sync circuit which extracts a clock signal CK from a data signal D in a random NRZ format, particularly in a phase sync circuit of a dual loop configuration including both a phase comparison circuit and a frequency comparison circuit, a clock signal Ca, another clock signal Cb having a phase delayed by an approximately ¼ period from the clock signal Ca and the data signal D are input to the frequency comparison circuit to output a logical value according to the high-low relationship between the frequency of the clock signal and the bit rate of the data signal D. The logical value is negatively fed back by the frequency comparison loop F2 to bring the frequency of the clock signal close to the bit rate of the data signal D. Consequently, a phase sync circuit can be provided which is capable of achieving both broadening of the capture range and extraction of a high-quality clock signal without requiring any reference clock signal.

Embodiment 2

Embodiment 1 has been described with respect to the operation of the frequency comparison circuit 20 in the phase sync circuit 40 of the present invention. There are some variations of the circuit configuration for realization this operation typified by one in Embodiment 2 described below.

Figure 10:
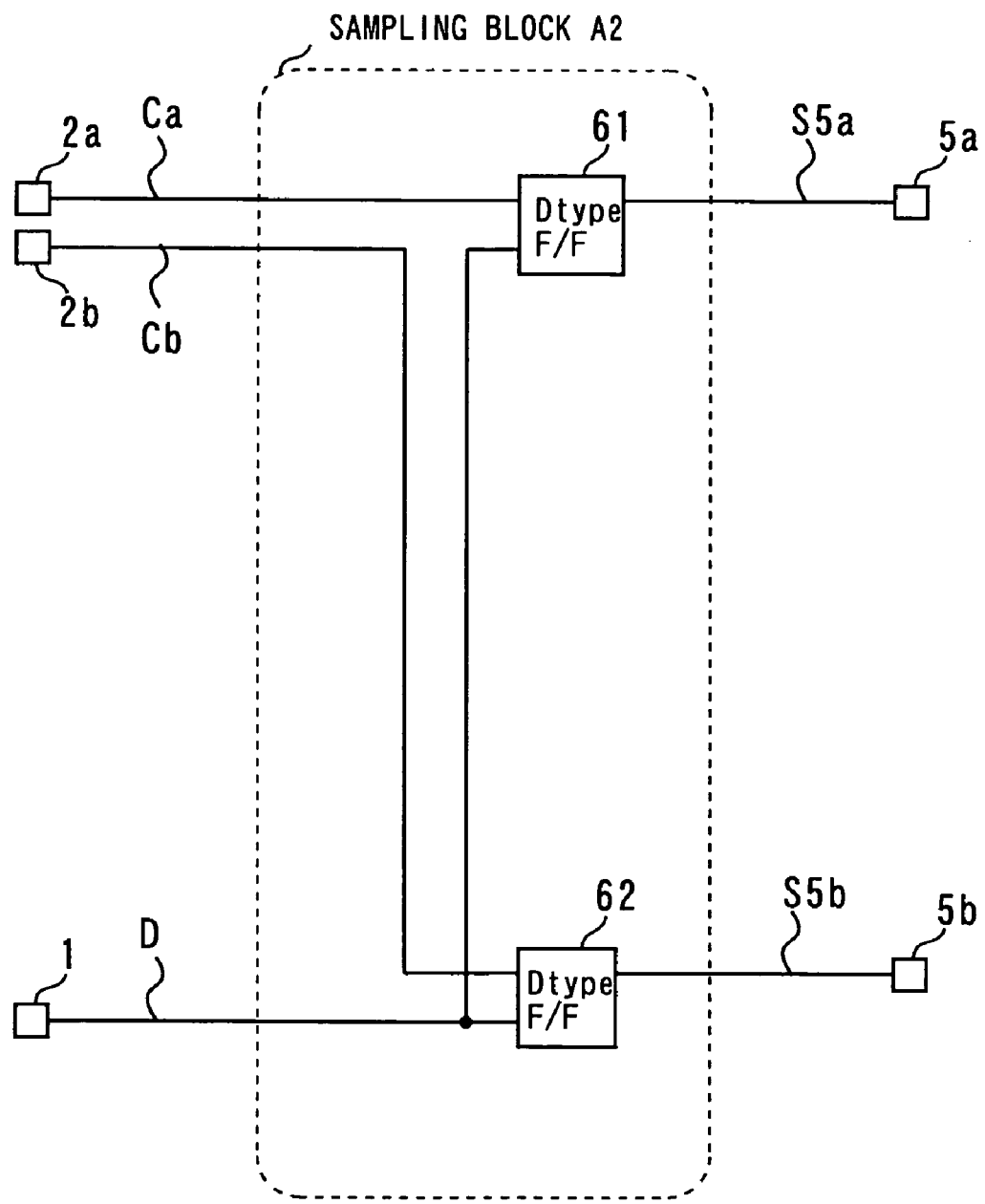
FIG. 10 shows a circuit forming a sampling block in Second Embodiment of the present invention.

FIG. 10 shows a circuit forming a sampling block A2 in Embodiment 2 of the present invention. Portions indicated in FIG. 10 by the same symbols as those in FIG. 3 have the same functions. No description will be made of the portions having the same functions. In FIG. 10, symbol 60 denotes another sampling block A2 corresponding to the implementation of the sampling block A, and symbols 61 and 62 denote D flip flop circuits. The sampling block A2 (60) is used instead of the sampling block A in the frequency comparison circuit 20 shown in FIG. 3 to make the minimum value of the pulse width in the signals S5a and S5b appearing at the terminals 5a and 5b about twice the pulse width at the same terminals in the case where the sampling block A is used, thus achieving a reduction in power consumption. On the other hand, in the case where the sampling block A is used, the transition density of the input data signal D described above is equivalently increased relative to that in the arrangement using the sampling block A2 (60). Therefore, the sampling block A has such a characteristic that the robustness against a data signal having a lower transition density is high.

According to Embodiment 2, as described above, the sampling block A2 (60) is used in place of the sampling block A of Embodiment 1 to make the minimum value of the pulse width in the signals S5a and S5b appearing at the terminals 5a and 5b about twice the pulse width at the same terminals in the case where the sampling block A is used, thus achieving a reduction in power consumption.

Embodiment 3

As the circuit for implementation of the phase comparison block C in the frequency comparison circuit 20 described above in the description of Embodiment 1, a different circuit such as one in Embodiment 3 may be implemented.

Figure 11:
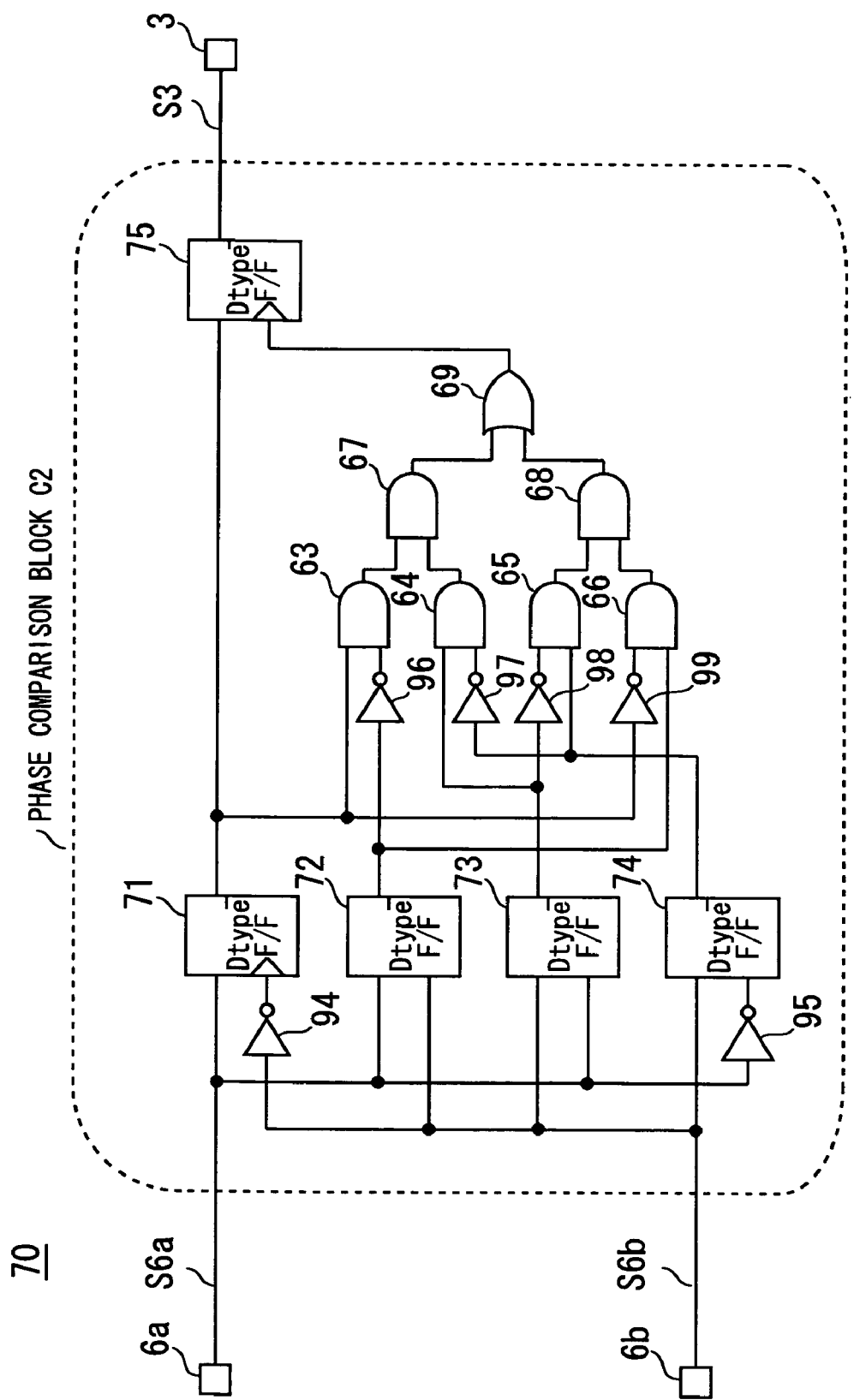
FIG. 11 shows the circuit in a phase comparison block in Third Embodiment of the present invention.

FIG. 11 shows the circuit in a phase comparison block C2 in Embodiment 3 of the present invention. Portions indicated in FIG. 11 by the same symbols as those in FIG. 3 have the same functions. No description will be made of the portions having the same functions. In FIG. 11, symbol 70 denotes another phase comparison block C2 corresponding to the implementation of the phase comparison block C; symbols 71 to 75 denote D flip flop circuits; symbols 63 to 68 denote AND circuits; symbol 69 denotes an OR circuit; and symbols 94 to 99 denote NOT circuits. The phase comparison block C2 (70) is used instead of the phase comparison block C in the frequency comparison circuit 20 shown in FIG. 3 to improve the accuracy with which verification is performed on the signals S6a and S6b input through the terminals 6a and 6b as to whether the signals have the characteristic corresponding to the above-described "principle of frequency comparison", thereby reducing the probability of the frequency comparison circuit 20 making erroneous determination.

On the other hand, in the case where the phase comparison block C is used, the circuit scale is smaller than that in the case where the phase comparison block C2 (70) is used. Therefore, the phase comparison block C has such a characteristic that a reduction in power consumption can be achieved.

According to Embodiment 3, as described above, the phase comparison block C2 (70) is used in place of the phase comparison block C of Embodiment 1 to improve the accuracy with which verification is performed on the signals S6a and S6b input through the terminals 6a and 6b as to whether the signals have the characteristic corresponding to the above-described "principle of frequency comparison" in comparison with the case where the phase comparison block C is used, thereby reducing the probability of the frequency comparison circuit 20 making erroneous determination.

INDUSTRIAL APPLICABILITY

As described above, the phase sync circuit of the present invention is useful as a phase sync circuit which extracts a clock signal CK from a data signal D in a random NRZ format, particularly a phase sync circuit of a dual loop configuration including both a phase comparison circuit and a frequency comparison circuit, wherein a clock signal Ca, another clock signal Cb having a phase delayed by an approximately ¼ period from the clock signal Ca and the data signal D are input to the frequency comparison circuit to output a logical value according to the high-low relationship between the frequency of the clock signal and the bit rate of the data signal D. The logical value is fed back negatively by the frequency comparison loop F2 to bring the frequency of the clock signal CK close to the bit rate of the data signal D. Therefore, the phase sync circuit of the present invention is suitably arranged as a phase sync circuit capable of achieving both broadening of the capture range and extraction of a high-quality clock signal without requiring any reference clock signal.

The invention claimed is:

1. A phase sync circuit which extracts a clock signal from an input data signal in a random NRZ format, said phase sync circuit comprising:
   a phase comparison circuit which makes a comparison between the phase of said clock signal corresponding to an output from said phase sync circuit and the phase of said data signal input to said phase sync circuit;
   a frequency comparison circuit to which said clock signal, another clock signal having a phase delayed by an approximately ¼ period from said clock signal and said data signal are input, and which makes a comparison between the frequencies of said data signal and said clock signal or said another clock signal;
   a low-pass filter to which the result of comparison in said phase comparison circuit and the result of comparison in said frequency comparison circuit are input, and which extracts and outputs a direct-current component;
   a voltage controlled oscillation circuit to which an output signal from said low-pass filter is input, and which outputs said clock signal; and
   a phase shifter to which said clock signal is input, and which outputs said another clock signal,
   wherein said frequency comparison circuit has:
   a sampling block including sampling circuits in two systems which respectively sample said clock signal and said another clock signal by said data signal to separately generate output signals;
   a waveform shaping block in which waveform shaping is performed on each of the output signals from the sampling circuits in the two systems in said sampling block to make pulses due to jitter contained in said data signal disappear and separately generate output signals; and
   a phase comparison block in which an advance or a delay of the phase between the output signals from the waveform shaping block is determined.

2. A phase sync circuit which extracts a clock signal from an input data signal in a random NRZ format, comprising:
   a phase comparison circuit which makes a comparison between the phase of said clock signal corresponding to an output from said phase sync circuit and the phase of said data signal input to said phase sync circuit;
   a frequency comparison circuit to which said clock signal, another clock signal having a phase delayed by an approximately ¼ period from said clock signal and said data signal are input, and which makes a comparison between the frequencies of said data signal and said clock signal or said another clock signal;
   a low-pass filter to which the result of comparison in said phase comparison circuit and the result of comparison in said frequency comparison circuit are input, and which extracts and outputs a direct-current component;
   a voltage controlled oscillation circuit to which an output signal from said low-pass filter is input, and which outputs said clock signal; and
   a phase shifter to which said clock signal is input, and which outputs said another clock signal,
   wherein said frequency comparison circuit has:
   a sampling block including sampling circuits in two systems which respectively sample said clock signal and said another clock signal by said data signal to separately generate output signals,
   a waveform shaping block in which waveform shaping is performed on each of the output signals from the sampling circuits in the two systems in said sampling block to separately generate two output signals, and
   a phase comparison block in which an advance or a delay of the phase between the output signals from the waveform shaping block is determined; and
   wherein, in said waveform shaping block, the output signal from the sampling circuit in one of the systems in said sampling block and the output signal from the sampling circuit in the other of the systems in said sampling block is sampled by sampling timing determined by referring to both output signals to perform said waveform shaping so that the high-low relationship between a frequency of said clock signal and said another clock signal and a bit rate of said data signal appears as an advance or a delay of the phase between said two output signals output from said waveform shaping block.

3. The phase sync circuit according to claim 2, characterized in that said waveform shaping block has:
   a first delay circuit connected to the sampling circuit in one of the systems;
   a first sampling circuit connected to said first delay circuit and to the sampling circuits in said two systems;
   a second delay circuit connected to the sampling circuit in the other of said systems; and
   a second sampling circuit connected to said second delay circuit and to the sampling circuits in said two systems; and
   that said waveform shaping is performed in such a manner that said first sampling circuit samples and outputs the output signal from the first delay circuit when the output signal from the sampling circuit in the other of said systems changes and when the output signal from the sampling circuit in said one of said systems does not change, and
   said second sampling circuit samples and outputs the output signal from the second delay circuit when the output signal from the sampling circuit in said one of said systems changes and when the output signal from the sampling circuit in the other of said systems does not change.

4. The phase sync circuit according to claim 3, characterized in that said first sampling circuit and said second sampling circuit have:
   a third delay circuit connected to the sampling circuit in the other of said systems;
   a first exclusive OR circuit connected to the sampling circuit in the other of said systems and to said third delay circuit;
   a fourth delay circuit connected to the sampling circuit in said one of said systems;
   a second exclusive OR circuit connected to the sampling circuit in said one of said systems and to said fourth delay circuit;
   a first inversion circuit connected to said first exclusive OR circuit;
   a second inversion circuit connected to said second exclusive OR circuit;
   a first logical product circuit connected to said first exclusive OR circuit and said second inversion circuit;
   a second logical product circuit connected to said second exclusive OR circuit and said first inversion circuit;
   a first D flip flop circuit connected to said first delay circuit and said first logical product circuit and having its output produced as an output from said first sampling circuit; and a second D flip flop circuit connected to said second delay circuit and said second logical product circuit and having its output produced as an output from said second sampling circuit.

5. The phase sync circuit according to claim 3, characterized in that said first delay circuit delays the output signal from the sampling circuit in said one of said systems by a time period equal to the time period required for sampling by said first sampling circuit; and that said second delay circuit delays the output signal from the sampling circuit in the other of said systems by a time period equal to the time period required for sampling by said second sampling circuit.

6. The phase sync circuit according to claim 3, characterized in that said phase comparison block has, for determination of an advance or a delay of the phase between the two output signals output from said waveform shaping block, third and fourth sampling circuits each connected to said first sampling circuit and said second sampling circuit, a third exclusive OR circuit connected to the third and fourth sampling circuits, and a fifth sampling circuit connected to the third sampling circuit and said third exclusive OR circuit; and that the high-low relationship between the frequency of said clock signal and said another clock signal and the bit rate of said data signal is indirectly determined through determination of an advance or a delay of the phase to generate a signal having one of two states: a high level and a low level representing the result of the determination.

7. The phase sync circuit according to claim 6, characterized in that said third sampling circuit samples the output signal from said first sampling circuit when the output signal from said second sampling circuit falls;

that said fourth sampling circuit samples the output signal from said first sampling circuit when the output signal from said second sampling circuit rises; and that said fifth sampling circuit samples and outputs the output signal from said third sampling circuit when the output signal from said third exclusive OR circuit rises.

8. The phase sync circuit according to claim 7, characterized in that a D flip flop circuit is used as each of said third sampling circuit, said fourth sampling circuit and said fifth sampling circuit.

9. The phase sync circuit according to claim 2, characterized in that said voltage controlled oscillation circuit is provided instead of said phase shifter as a circuit to which the output signal from said low-pass filter is input and which outputs said clock signal and said another clock signal.

10. A frequency comparison circuit having a clock signal input terminal, a delayed clock signal input terminal, a data signal input terminal and an output terminal, comprising:

a sampling block, including:
    a first sampling circuit to sample the clock signal by the data signal and generate a first sampling block output signal, and
    a second sampling circuit to sample the delayed clock signal by the data signal and generate a second sampling block output signal, a waveform shaping block, including:
    a first sampling circuit to sample the first sampling block output signal by the first and second sampling block output signals and generate a first waveform shaping block output signal, and
    a second sampling circuit to sample the second sampling block output signal by the first and second sampling block output signals and generate a second waveform shaping block output signal; and a phase comparison block to determine an advance or a delay of the phase between the first and second waveform block output signals.

* * * * *